US 6,669,087 B2

(12) United States Patent
Wiklof et al.

(10) Patent No.: US 6,669,087 B2
(45) Date of Patent: Dec. 30, 2003

(54) METHOD AND APPARATUS FOR ACCESSING PRODUCT INFORMATION USING BAR CODE DATA

(75) Inventors: Christopher A. Wiklof, Everett, WA (US); P. Thomas Greer, Kirkland, WA (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/785,851

(22) Filed: Feb. 16, 2001

(65) Prior Publication Data

US 2001/0030234 A1 Oct. 18, 2001

Related U.S. Application Data

(60) Provisional application No. 60/183,421, filed on Feb. 18, 2000.

(51) Int. Cl.$^7$ .............................................. G06K 15/00
(52) U.S. Cl. ................................. 235/383; 235/462.01
(58) Field of Search .................................. 235/383, 385, 235/378, 462.01, 462.14, 462.24, 462.49

(56) References Cited

U.S. PATENT DOCUMENTS

| 5,493,107 A | * | 2/1996 | Gupta et al. | 235/383 |
| 5,978,772 A | * | 11/1999 | Mold | 235/462.01 |
| 6,012,102 A | * | 1/2000 | Shachar | 235/462.01 |
| 6,045,048 A | * | 4/2000 | Wilz, Sr. et al. | 235/472.01 |
| 6,189,789 B1 | * | 2/2001 | Levine et al. | 235/383 |
| 6,367,694 B1 | * | 4/2002 | Roslak | 235/380 |

* cited by examiner

Primary Examiner—Daniel St. Cyr
(74) Attorney, Agent, or Firm—Orum & Roth

(57) ABSTRACT

A method and apparatus for providing a user product information via scanning of a machine readable symbology on a product. A symbology, for example a bar code, is scanned and the data therein passed into a URL which is used to present related product information to a user via the internet. The URL may directly link to the information or be a look up database for further redirection.

18 Claims, 8 Drawing Sheets

METHOD AND APPARATUS FOR ACCESSING PRODUCT INFORMATION USING BAR CODE DATA

CROSS REFRENCES TO RELATED APPLICATIONS

The present application claims benefit of U.S. Provisional Patent Application 60/183,421 filed Feb. 18, 2000 entitled METHOD AND APPARATUS FOR ACCESSING PRODUCT INFORMATION.

TECHNICAL FIELD

The present invention is directed to the field of bar code data collection and more particularly to the field of accessing information pertaining to a bar coded object.

BACKGROUND OF THE INVENTION

The efficient distribution of product-related information to end-users and potential end-users is an important tool for minimizing sales cycle times, improving user satisfaction, reducing warranty costs, and minimizing manufacturer liability. The presentation of desired and regulated information often occupies a great deal of product label space and is often limiting to the industrial and aesthetic design of product packaging.

Explosive growth of the Internet and World Wide Web has provided an efficient means for the distribution of information, and product-related information in particular. To date, accessing product information has required a user to determine the manufacturer of the product, determine the manufacturer's URL, enter the URL into a web browser, and search the manufacturer's web site to find relevant product information.

The present invention makes use of a product's UPC or other symbol to access data about the product.

The symbology-related background of the invention is described in *The Bar Code Book* by Roger C. Palmer, hereby incorporated by reference.

In the field of automated data collection and, more particularly, optical data encodation, bar code symbologies have achieved wide use and have proved themselves to be very reliable and cost effective. Conventional linear bar code symbologies encode data as a series of variable width bars separated by variable width spaces. Generally, bars are formed from dark ink on a light colored background that forms the spaces.

One particularly successful and widespread family of bar code symbologies is the UPC/EAN/JAN family. This group of bar code symbologies is used to uniquely identify virtually every type of pre-packaged retail item sold in i.e. U.S. and Canada, Europe, and Japan, respectively.

SUMMARY OF THE INVENTION

The present invention teaches a method and apparatus for providing rapid and convenient Internet access to information about a product using the product's UPC/EAN/JAN symbol to locate the information.

One aspect of the present invention relates a business method involving registering at least a portion of a product's UPC/EAN/JAN symbol as a URL for accessing information about the product.

Another aspect of the present invention relates to a method of scanning a symbol, parsing data from the symbol, appending additional data to form a URL, opening a browser, directing the browser to the URL, and displaying information relevant to the symbol.

Another aspect of the present invention relates to a device for scanning a product symbol, accessing a URL corresponding to the product symbol, and displaying data relative to the product.

Another aspect of the present invention relates to a business method involving the formation of a web site that provides links to manufacturers of products using at least a portion of product UPC/EAN/JAN symbols to determine the links.

Another aspect of the present invention relates to a business method involving a web application that stores product data, receives a query from an end device, and transmits product data to the end device according to UPC/EAN/JAN data contained within the query.

DETAILED DESCRIPTION OF THE INVENTION

The present invention contemplates a method and apparatus for rapid access to product and company information via an Internet connection. A UPC, EAN, or JAN symbol is scanned or alternatively entered by hand. An Internet URL corresponding to symbol data is contacted and data therefrom displayed on an end device. The invention includes end devices and computer software for carrying out the invention as well as a method of doing business.

In the past, the only product information available to an end-user at the point of sale was that which was physically printed on a product label. Sales were delayed or lost when a user desired additional information but had to seek that information elsewhere.

The present invention brings complete product information to a user at the point of sale using the existing product code infrastructure to address said information. This solution avoids needing to print additional information on the label, avoids needing to create an essentially duplicate data index to address additional information, but does result in relevant information being delivered to the potential purchaser or subsequent user.

An end device scans the UPC (or alternatively, the EAN or JAN) symbol on a product. Scanned data is appended to appropriate prefix and suffix data and is used to address a web site displaying product information. For example, for a product carrying the UPC symbol encoding the data "0 43100 06622 4", a prefix comprising the characters "http:\\www." and a suffix comprising the domain ".com" would be appended to form a URL reading "http:\\www.043100066224.com". This address would be used by a browser to access data about the corresponding product, for instance, "The Mead Corporation, Dayton, Ohio 45463 U.S.A. Made In USA. 100 sheet college ruled 1 subject notebook. College ruled 11×8½ in (27.9×21.5 cm). Available in several colors, powder blue, royal blue, crimson, insignia yellow, and fir green. See also product number 06623, our equivalent wide ruled 1 subject notebook. See your local retailer, contact us at (000) 555-1234, or press the 'order' button to purchase. Mead manufactures a wide range of paper products for all your needs. Press 'home' to access a complete catalog."

An alternative embodiment accesses a pre-determined URL which, in turn, passes a second URL back to the end device to access product data.

A second alternative embodiment sequentially attempts connection with several possible URLs having data on the product at hand, including domains such as .com, .net, .gov, .org, etc.

Figure 1:
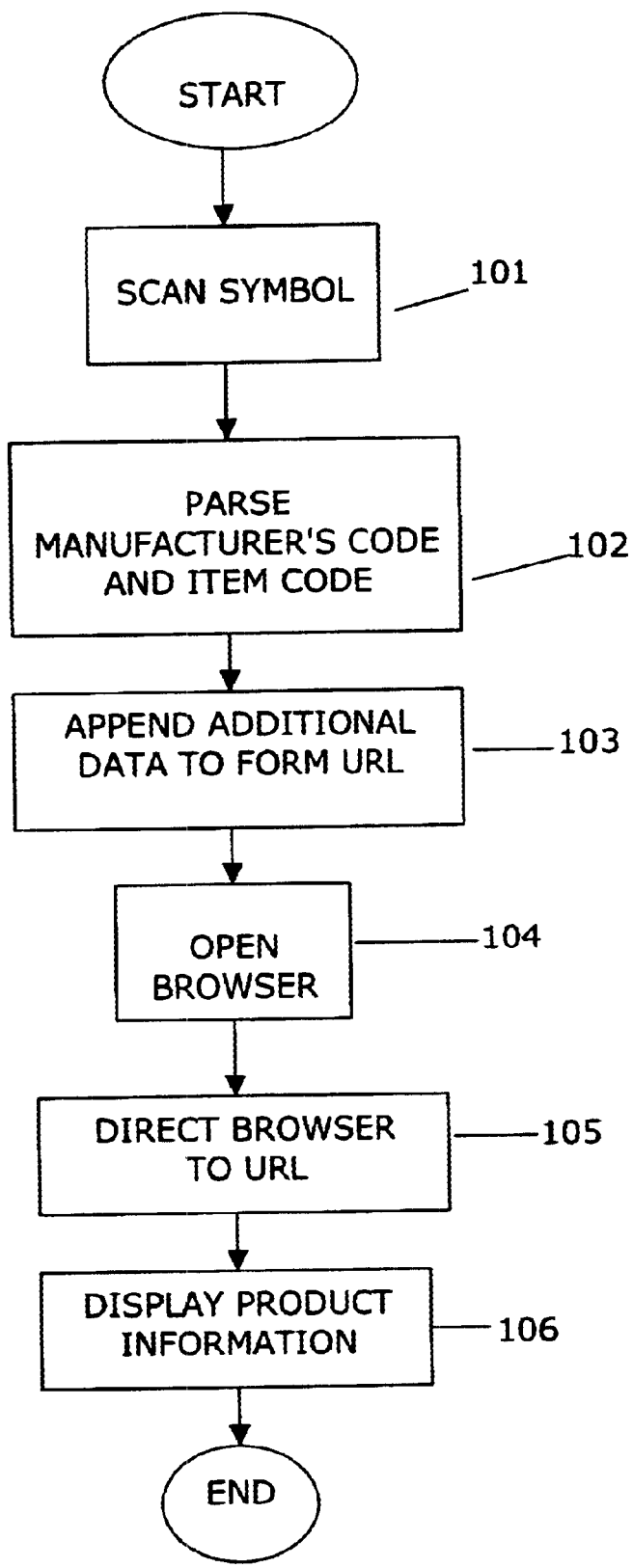
FIG. 1 shows a method for an end device to scan a symbol, form a URL containing data from the symbol, access a web site corresponding to the URL with a browser, and display data transmitted from the web site.

FIG. 1 illustrates a method for scanning a symbol to access data associated with the symbol. In step 101, the symbol is scanned. This may be via a fixed scanner, a hand-held discrete scanner connected to a reader, or an integrated end device. Step 102 indicates the parsing of relevant data from the symbol. A first set of data, the manufacturers code, is extracted from the left side of the symbol. A second set of data, the product code, is extracted from the right side of the symbol. An optional piece of data, the number system, may also be extracted to determine additional information such as the domain. In step 103, data is combined with manufacturer's and optionally product data to form a complete URL. In optional step 104, a browser is opened and in step 105, the browser is directed to the URL formed in step 103 using IP. Product information received from the URL, corresponding to the scanned symbol, is then displayed to the user in step 106.

Figure 2:
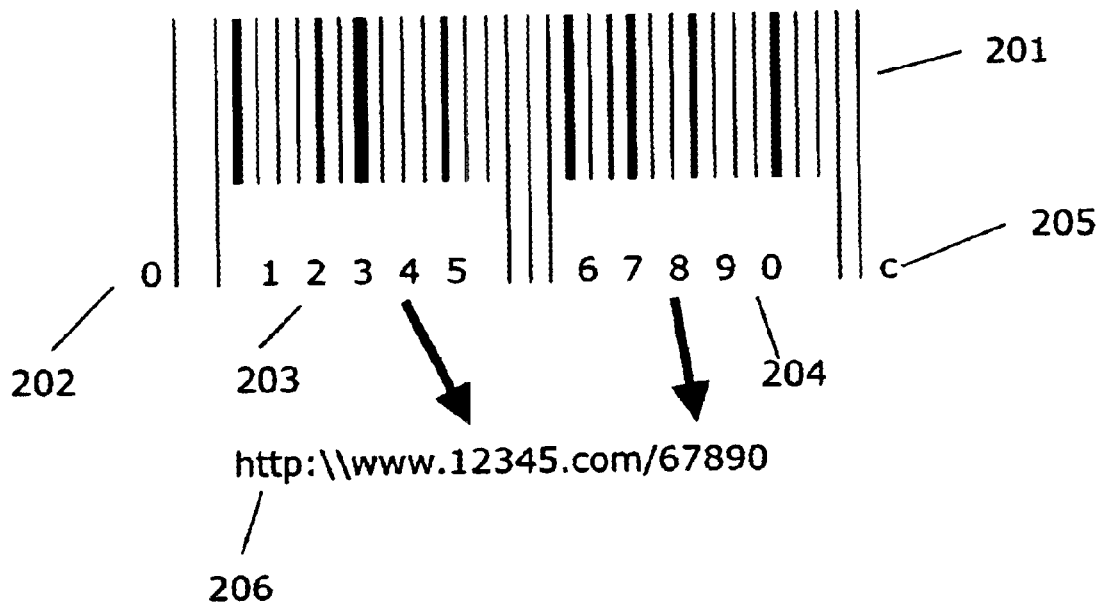
FIG. 2 shows a method for parsing symbol data to form a URL containing at least some of the symbol data.

FIG. 2 illustrates one exemplary method for parsing symbol data into a URL. A UPC, EAN, or JAN symbol 201 comprises four data components. A first data component 202 is known as the number system and indicates a region of origin or other types of symbols. The first data component is encoded in a parity pattern in the left half of the symbol. Codewords in the left half of the symbol directly encode a manufacturer's identification 203. The right half of the symbol directly encodes a product identification 204 associated with the manufacturer associated with the manufacturer's identification 203. A modulus 10 check character 205 is encoded as a parity pattern in the codewords of the right half of the symbol. In the example shown in FIG. 2, the fixed characters "http:\\www." form the first portion of the URL.

The manufacturer's code "12345" is parsed to form the next portion of the URL. The characters ".com/" are then added to the end of the manufacturer's code as the domain. Other alternative domains may also be used. The product code "67890" then forms the last part of the URL. The entire URL 206 is thus assembled to form the data string "http:\\www.12345.com/67890". This address may then be used to access data about the product labeled with the symbol 201. The example shown in FIG. 2 illustrates a way to access data directly from the manufacturer when the manufacturer holds the URL associated with the manufacturer's code.

Figure 3:
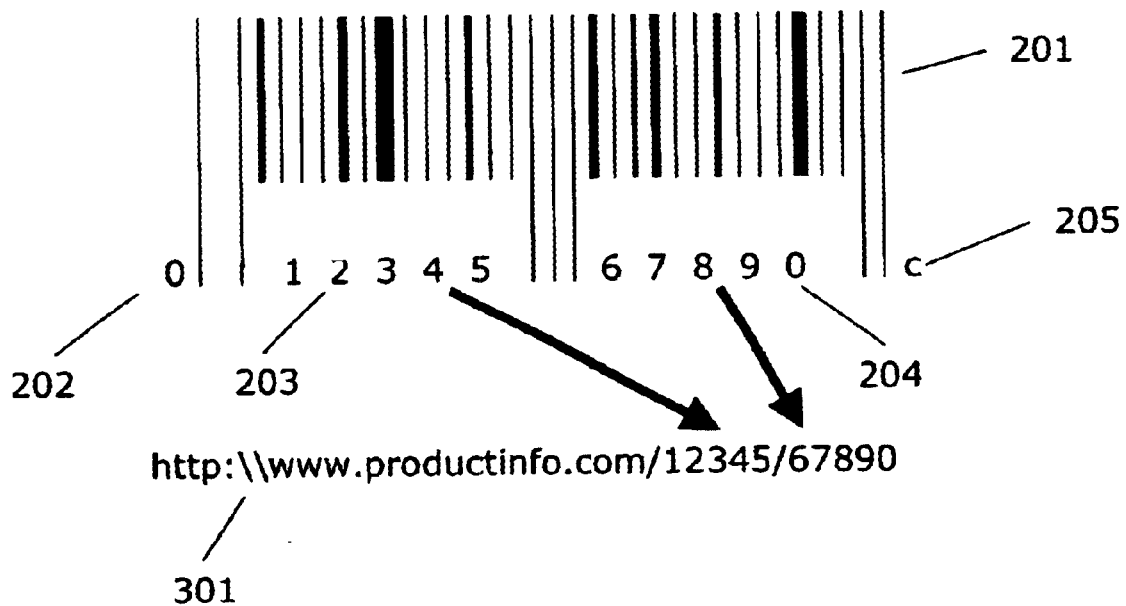
FIG. 3 shows another method for parsing symbol data to form a URL containing at least some of the symbol data.

FIG. 3 shows an alternative example of a way to construct a URL from a UPC/EAN/JAN symbol. This method shows a way to access product data through a third party web application. In this case, product information is appended below the domain. The alternative URL 301 "http:\\www.productinfo.com/12345/67890" accesses product information via a web site called "productinfo.com".

Figure 4:
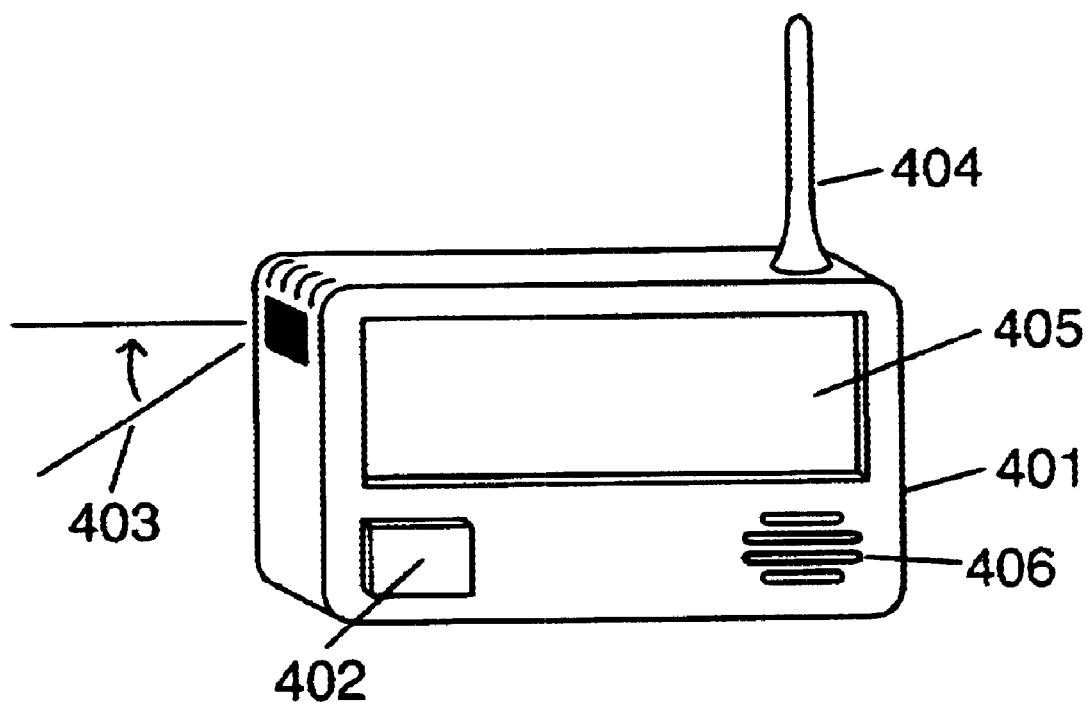
FIG. 4 shows a wireless apparatus for scanning a symbol, parsing symbol data to form a URL containing at least some of the symbol data, accessing a web site using the wireless link, and displaying data corresponding to the symbol.

FIG. 4 shows a wireless end device for accessing product information. A body 401 has a scan button 402 that is used to enable a scanner 403. Scanner 403 uses any of several scanning technologies known to the art including moving beam laser, CCD or CMD imager, or fixed spot wand. Upon scanning a symbol, a microcomputer in the end device; comprising at least a microprocessor, memory, and I/O; performs preprocessing steps described elsewhere in this document. The device of FIG. 4 then accesses product information on a server via a wireless interface through an antenna 404 and presents the information to a user on a display 405 or audibly via a speaker 406.

Figure 5:
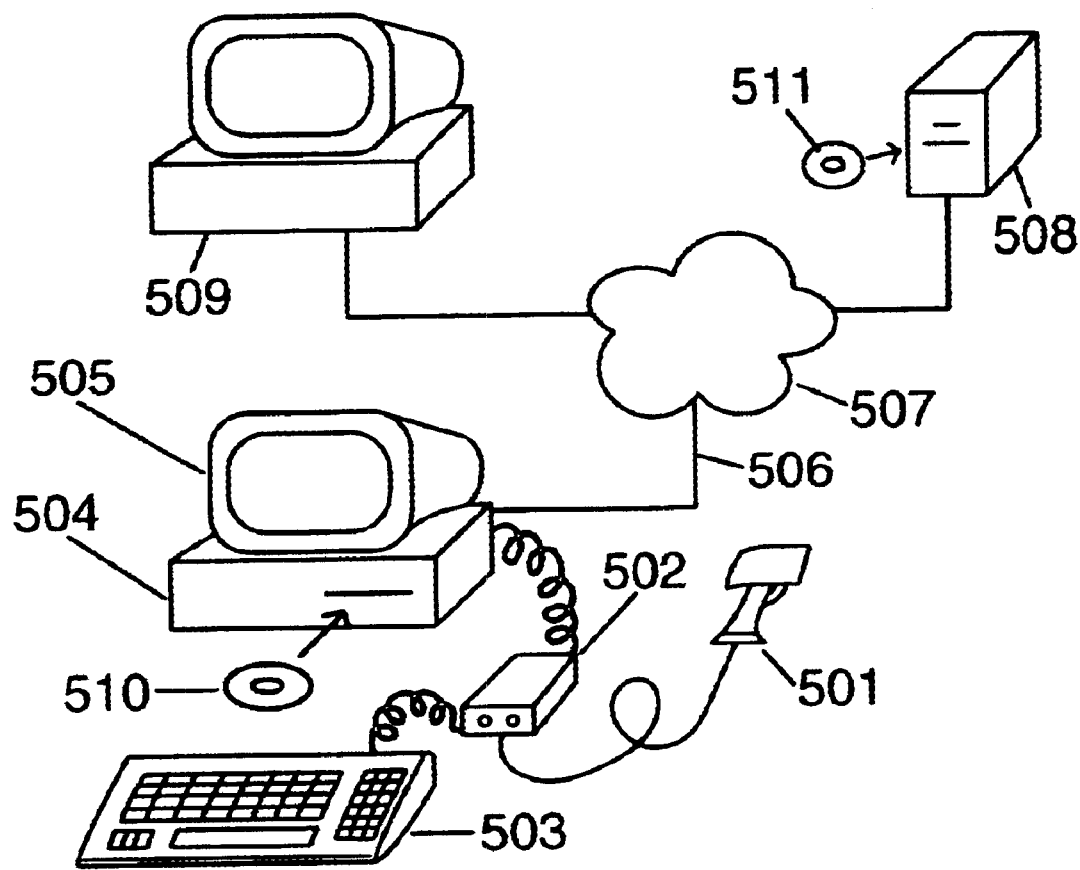
FIG. 5 shows a computer system for scanning a symbol and accessing product data corresponding to the symbol over the Internet.

FIG. 5 shows a computer having a scanner connected via the Internet to one or more servers holding information about products. A bar code scanner 501 is used to scan symbols and is connected to a wedge reader 502. The wedge reader 502 is connected between a keyboard 503 and a computer 504 such that data scanned by the scanner 501 appears to come from the keyboard 503. The wedge reader 502 may be programmed to do data parsing and data appending described elsewhere in this document. Alternatively, the scanner 501 may be connected to the computer 504 using an alternate port such as a serial port, a bi-directional parallel port, a firewire port, a SCSI port or other port. Data may be passed to an application via other means including writing the application to check the ports or via a virtual wedge. The computer 504 is connected to the Internet 507 via a wired or wireless interface 506. Interface 506 can include a conventional modem, a cable modem, a LAN, a digital subscriber line, a cellular modem a satellite link, or other connection to the Internet. A first server 508 and, optionally, a second server 509 are connected to the Internet. Additional servers (not shown) are also available to ftp, http, and other access types by the computer 504 and each other. Portable media 510 and 511 may be used to load programs into a client computer 504 or server 508, respectively.

Figure 6:
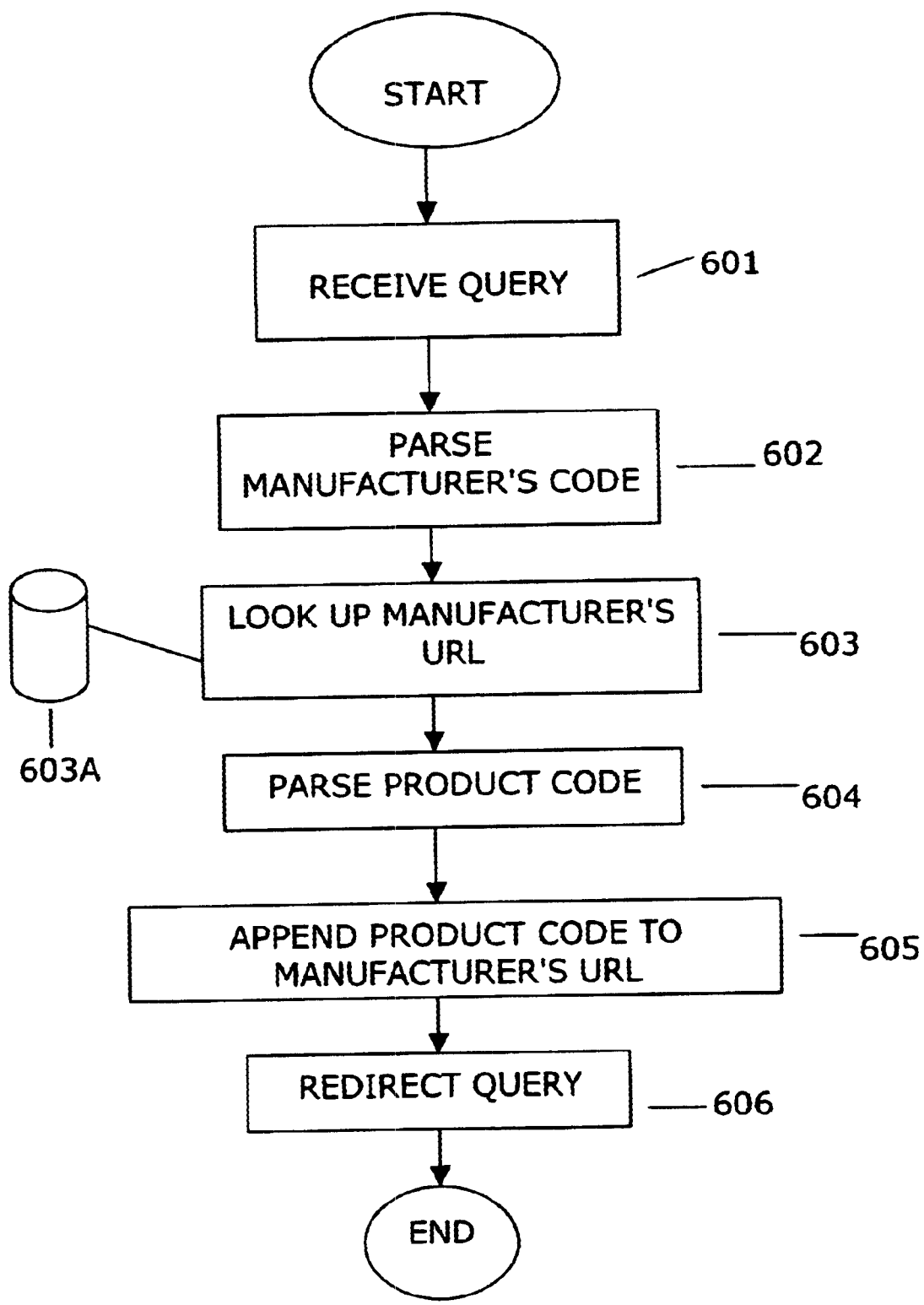
FIG. 6 shows a method for receiving a query containing data corresponding to a symbol on a server and redirecting the query to a second server having data corresponding to the symbol.

FIG. 6 shows a server-based method for directing a product information query to a manufacturer's web site for response. A query is received via means known to the art in step 601. The manufacturer's code is extracted from the received URL in 602 and the manufacturer's web address is looked up in a database 603a by step 603. The product code is parsed from the received URL in 604. In step 605, the manufacturer's web address and the product code are combined to form a new URL where relevant product data resides. In step 606, the user's query is hyperlinked to the URL determined in step 605 using known technology.

Figure 7:
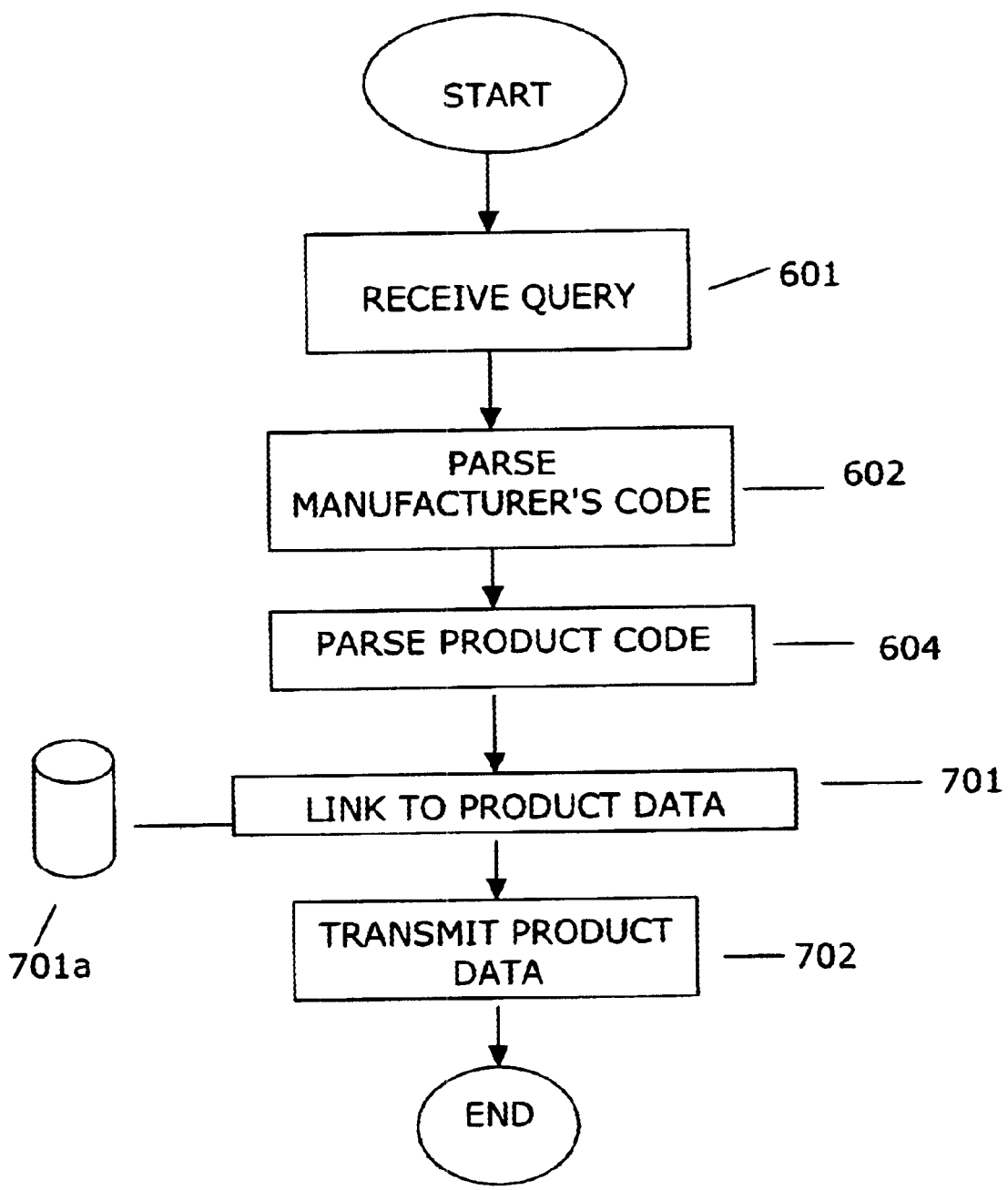
FIG. 7 shows a method for receiving a query containing data corresponding to a symbol on a server, looking up data corresponding to the symbol, and transmitting data corresponding to the symbol to the requesting device.

FIG. 7 shows a server-based method for responding to a query for product data. After the query is received in step 601, the manufacturers code and item code are parsed in steps 602 and 604, respectively. The query is then linked directly to product data residing on database 701 a in step 701. The product data is then returned to the client in step 702.

Figure 8:
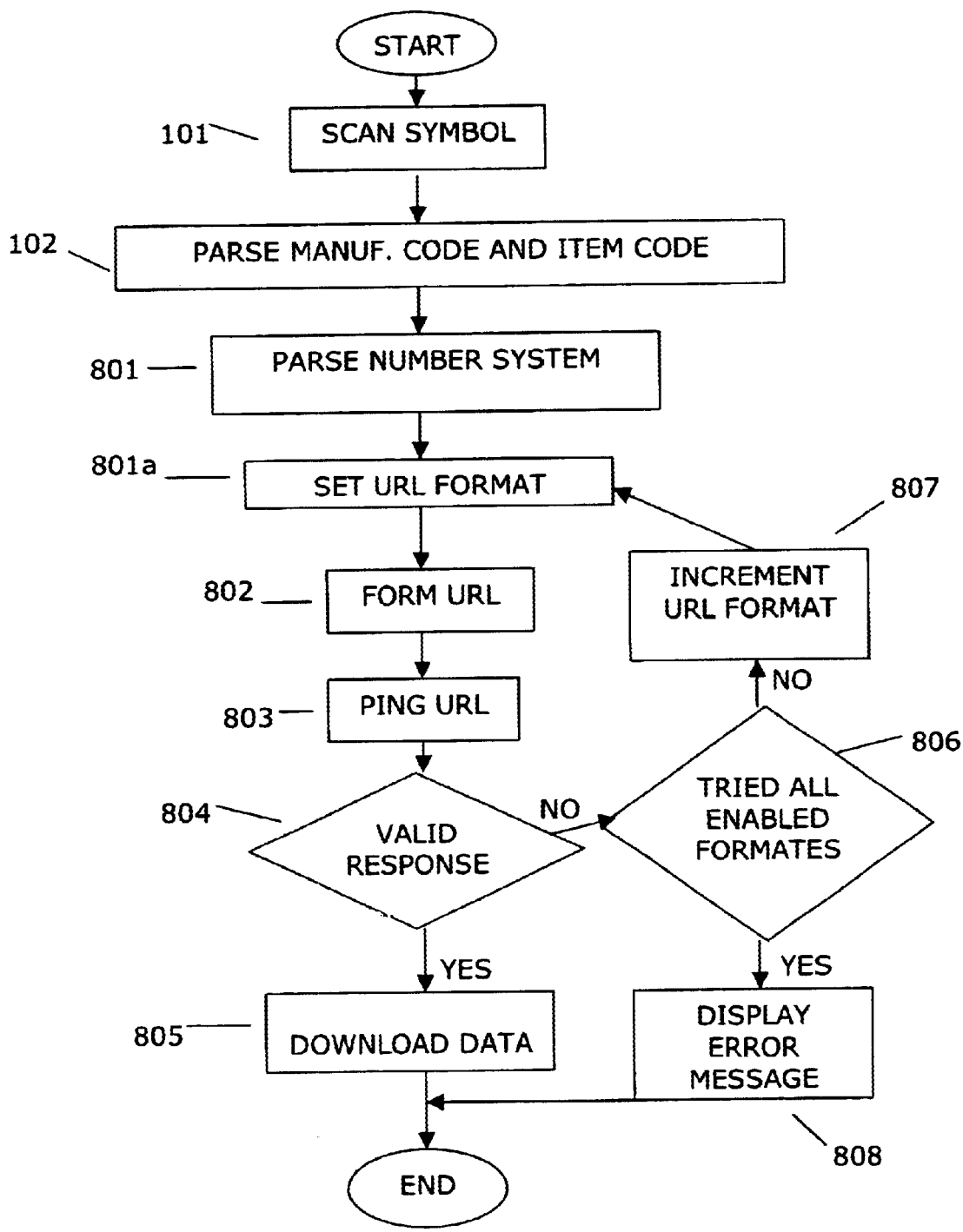
FIG. 8 shows a method for use in an end device that includes steps for trying a plurality of URLs for accessing product information.

FIG. 8 shows a client-based method for accessing product information. This method corresponds to the method shown in FIG. 1 but includes a method for searching several possible URLs for the data. After manufacturer and item codes are extracted in step 102, optional step 801 further extracts the number system value. In step 801a, a URL format is selected. This may be done using the number system and, optionally, the manufacturer code to select the most likely format. Different possible formats may be selected in order of highest-probability or in simple list order. Examples of different forms include those using the manufacture code before the domain (for example www.12345.com/67890); using known database sites before the domain with the manufacturer, item code, and, optionally, number system following the domain (for example www.productinfo1.com/1234567890/0 or alternatively www.getdara.org/12345/67890); or using a different domain based upon number system (for instance www.swedishinfo.se/12345/67890) when the number system indicates the possibility of the manufacturer being Swedish). A URL to try is then formed using the selected format along with data from the instant symbol in step 802. The URL is accessed or pinged in step 803. A test is performed in step 804 to determine if the web site is valid and, optionally, if it contains relevant product information. The test in step 804 may include determining if the site responds, determining if the format of the site is consistent with product data, and/or determining if the content of the site is consistent with product data. Additionally, step 804 may include asking the user if the site contains the information sought. If the web site does contain valid data, then the data is downloaded and displayed on the end device in step 805. If the web site is not valid, then a test is made to determine if all known possibilities have been exhausted in step 806. If yes, then an error message is displayed to the user in step 808 indicating that the information sought could not be found. If there are remaining URL formats to be tried then a pointer is advanced to the next most likely or the next URL in a predetermined list in step 807 and the process of forming a URL and trying it repeated.

Figure 9:
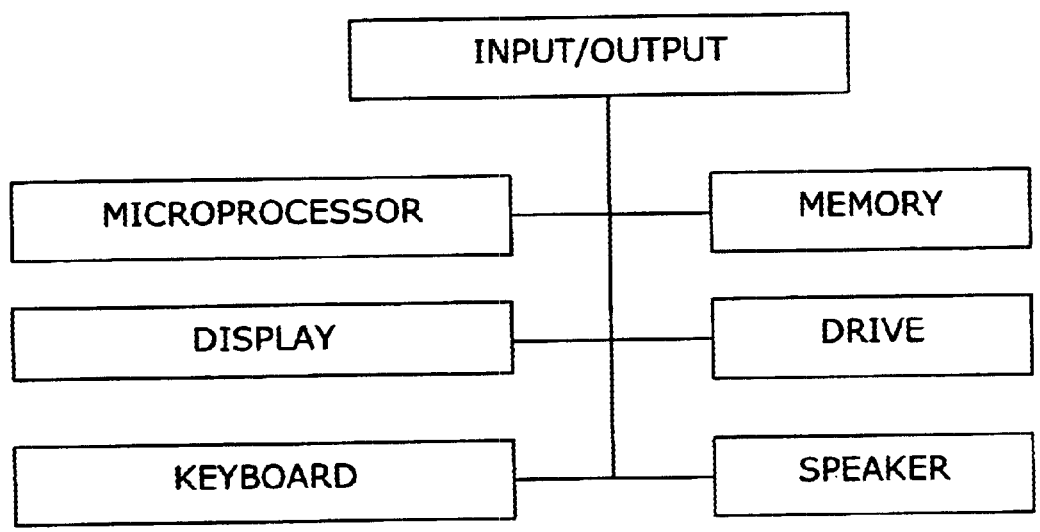
FIG. 9 shows a typical configuration for a computer means.

FIG. 9 shows a block diagram for a microcomputer-based end device such as those shown in FIG. 4 or 5.

Figure 10:
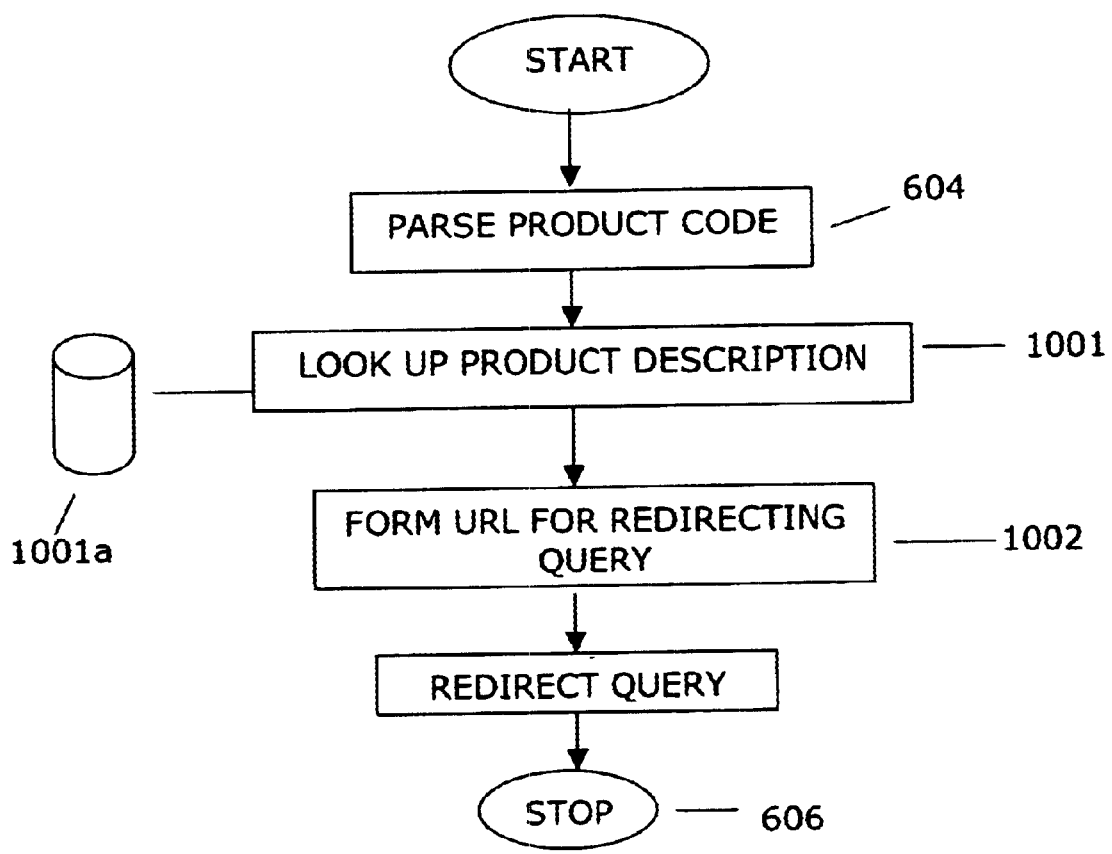
FIG. 10 shows optional steps to the process shown in FIG. 6.

FIG. 10 shows optional steps to the process shown in FIG. 6. In FIG. 10, the product or item code for a given manufacturer is compared to a database 1001a in step 1001 to determine possible synonyms. For instance, the manufacturer corresponding to manufacturer code 12345 may have a path on its web site to the product corresponding to 67890 that is not literally "/67890".

Database 1001a contains an equivalency that indicates the product corresponding to item code 67890 may be found at "/bluesuedeshoes" on the manufacturer's web site. In this case a URL comprising the characters "http:\\www.kingshoes.com/bluesuedeshoes" may be formed in step 1002. The query is subsequently hyperlinked to "http:\\www.kingshoes.com/bluesuedeshoes" according to step 606.

It will thus be seen that according to the present invention a simple yet effective means and apparatus for conveniently accessing product information has been taught. While the invention that has been shown herein is the most practical and preferred embodiment as presently conceived, it will be apparent to those of ordinary skill in the art that many modifications may be made thereof within the scope of the invention, which scope is to be accorded the broadest interpretation of the appended claims so as to encompass all equivalent structures and methods.

What is claimed is:

1. A method for parsing data from a symbol to form a URL, comprising the steps of:
    decoding data received by scanning a machine-readable symbol;
    assigning a network prefix to a front portion of said data;
        appending a domain name at said data end, wherein the parsing further comprises additional steps of:
        determining synonyms for the front portion of said data before assigning the network prefix; and
        assigning the network prefix and appending the domain name to at least one synonym for the front portion.

2. A method of claim 1 further including the step of parsing the data into a site name and discreet file locations at the site by assigning a fixed number of digits to be the site name and the remaining digits as a pointer or sub-pointers to sub-locations at the site name.

3. The method of claim 1 wherein rather than appending the domain name, a series of domains are alternatively assigned until one containing data is found.

4. The method of claim 1, wherein the machine-readable symbol is a UPC, EAN or JAN symbol on a product.

5. A method for retrieving information related to a machine-readable symbol comprising the steps of:
    scanning the machine-readable symbol;
    parsing data received from the machine-readable symbol into a URL, said parsing comprising the steps of:
        decoding the data received by scanning the machine-readable symbol;
        assigning a network prefix at a front of a portion of said data;
        appending a domain name at an end of the portion of said data; connecting a user to the URL, wherein the parsing further comprises additional steps of:
        determining synonyms for the portion of said data before assigning the network prefix; and
    assigning the network prefix and appending the domain name to at least one synonym for the portion.

6. The method of claim 5 wherein the data received from the machine-readable symbol is parsed into the URL of a host website and a file location at the host website.

7. The method of claim 5 wherein the data received from the machine-readable symbol is parsed into a first URL of a host website and a code;
    when the first URL is connected to, said code is decoded into a second URL to which the user is then connected to.

8. The method of claim 7 wherein the code is decoded by the host website and product data related to the code is then transmitted to the user.

9. The method of claim 5 wherein rather than appending a domain name, a series of domain names are alternately assigned until one containing data is found.

10. The method of claim 5 wherein said URL is a host web-site for a manufacturer.

11. The method of claim 5 further comprising the steps of locating manufacturer data, product data, or both on the host web-site, and transmitting the data to the user.

12. The method of claim 5 comprising the additional step of locating product data, manufacturer data or both from a web-site associated with the URL, and transmitting the data to the user.

13. The method of claim 12 wherein the web-site is a manufacturer's web-site, a product web-site, a merchant web-site, a third-party web-site or a combination thereof.

14. The method of claim 5, further comprising the step of assembling the URL to form a data string that contains at least a second portion of said data.

15. The method of claim 5 further comprising the steps of determining synonyms for at least a second portion of said data and assembling the URL to form a data string that contains at least one synonym for the second portion.

16. The method of claim 5, further comprising the steps of determining synonyms for at least a second portion of said data and assembling the URL to form a data string that contains at least one synonym for the second portion.

17. A system for retrieving data related to a machine-readable symbol comprising:

a machine-readable symbol scanner, connectable to a computer means having an Internet connection, at least one Internet server containing data related to the machine readable symbol;

a software means for parsing data received into the computer means from the scanner into a URL, connecting to the Internet, accessing data related to the machine-readable symbol and displaying the data to a user;

said software means for parsing data comprising means for decoding data received by scanning the machine-readable symbol, for assigning a network prefix to a front portion of said data, and for appending a domain name and an end portion of said data, wherein the parsing further comprises additional steps of:

determining synonyms for the front portion of said data before assigning the network prefix; and assigning the network prefix and appending the domain name to at least one synonym for the front portion.

18. The system of claim 17 wherein the scanner is connected to the computer means via a wedge device inserted between a computer keyboard and a computer.

* * * * *